(12) United States Patent
Liu et al.

(10) Patent No.: US 9,978,761 B2
(45) Date of Patent: May 22, 2018

(54) SELF-ALIGNED FLASH MEMORY DEVICE

(71) Applicant: Taiwan Semiconductor Manufacturing Co., Ltd., Hsin-Chu (TW)

(72) Inventors: Ming-Chyi Liu, Hsinchu (TW); Shih-Chang Liu, Alian Township (TW); Sheng-Chieh Chen, Taichung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days. days.

(21) Appl. No.: 15/216,872

(22) Filed: Jul. 22, 2016

(65) Prior Publication Data
US 2017/0345835 A1 Nov. 30, 2017

Related U.S. Application Data

(60) Provisional application No. 62/342,596, filed on May 27, 2016.

(51) Int. Cl.
| | | |
|---|---|---|
| H01L 27/105 | (2006.01) | |
| H01L 27/11526 | (2017.01) | |
| H01L 27/11519 | (2017.01) | |
| H01L 27/11521 | (2017.01) | |
| H01L 27/11556 | (2017.01) | |

(52) U.S. Cl.
CPC .... H01L 27/11526 (2013.01); H01L 27/1052 (2013.01); H01L 27/11519 (2013.01); H01L 27/11521 (2013.01); H01L 27/11556 (2013.01)

(58) Field of Classification Search
CPC ......... H01L 27/11526; H01L 27/11519; H01L 27/11521; H01L 27/11556; H01L 27/1052
See application file for complete search history.

(56) References Cited

U.S. PATENT DOCUMENTS

| | | | | |
|---|---|---|---|---|
| 2008/0217675 A1* | 9/2008 | Liu | ................... | H01L 21/28273 257/321 |
| 2014/0091382 A1* | 4/2014 | Tadayoni | .......... | H01L 21/28273 257/320 |
| 2015/0126040 A1* | 5/2015 | Korolik | ............... | H01L 21/3065 438/718 |

* cited by examiner

*Primary Examiner* — Long Pham
(74) *Attorney, Agent, or Firm* — Eschweiler & Potashnik, LLC

(57) ABSTRACT

The present disclosure relates to an improved integrated circuit having an embedded flash memory device with a word line having its height reduced, and associated processing methods. In some embodiments, the flash memory device includes a gate stack separated from a substrate by a gate dielectric. The gate stack includes a control gate separated from a floating gate by a control gate dielectric. An erase gate is disposed on a first side of the gate stack and a word line is disposed on a second side of the gate stack that is opposite to the first side. The word line has a height that monotonically increases from an outer side opposite to the gate stack to an inner side closer to the gate stack. A word line height at the outer side is smaller than an erase gate height.

20 Claims, 12 Drawing Sheets

SELF-ALIGNED FLASH MEMORY DEVICE

REFERENCE TO RELATED APPLICATION

This Application claims priority to U.S. Provisional Application No. 62/342,596 filed on May 27, 2016, the contents of which is hereby incorporated by reference in its entirety.

BACKGROUND

Flash memory is an electronic non-volatile computer storage medium that can be electrically erased and reprogrammed. It is used in a wide variety of electronic devices. To store information, flash memory includes an addressable array of memory cells having charge storage components. Common types of flash memory cells include stacked gate memory cells, two transistor memory cells and split gate memory cells. Compared to two transistor cells, split gate memory cells have a smaller area. Compared to stacked gate memory cells, split gate memory cells have higher injection efficiency, less susceptibility to short channel effects, and better over erase immunity.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
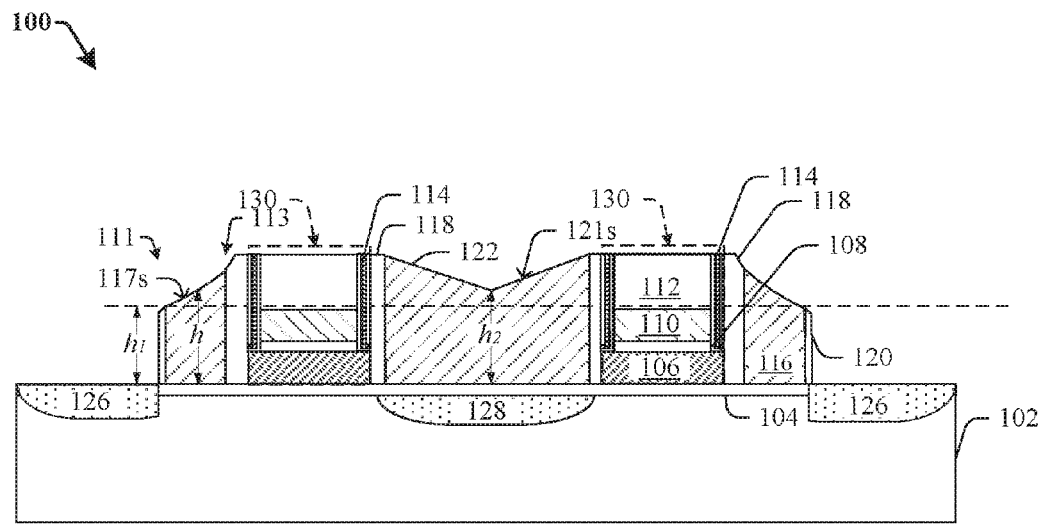
FIG. 1 illustrates a cross-sectional view of some embodiments of a flash memory device having a word line height smaller than an erase gate height.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some integrated circuits have an array of pairs of split-gate flash memory cells (e.g., EFS3 memory cells) arranged in rows and columns. In some designs, a pair of split-gate flash memory cells has a pair of gate stacks and a common source/drain region disposed between the pair of gate stacks and shared by the cells of the pair. First and second individual source/drain regions are located on opposite sides of the gate stacks, resulting in a first channel region extending between the first individual source/drain region and the common source/drain region and a second channel region extending between the common source/drain region and the second individual source/drain region. A first word line corresponding to the first memory cell is arranged over the first channel region, while a second word line corresponding to the second memory cell is arranged over the second channel region. An erase gate is arranged over the common source/drain region.

During manufacture of the flash memory cells, word lines and erase gates can be formed by depositing one conductive material (e.g. polysilicon) over a substrate. In some approaches, the word lines may have "pulled up" outer edges supported by a dielectric sidewall, resulting in concave top surfaces of the word lines and a word line height greater than an erase gate height. Such a concave shape makes it more difficult for an overlying contact to make good contact with the word line or an overlying silicide layer (e.g., the concave surface may leave voids between some regions between a contact and a word line). Furthermore, the greater height of the word lines may result in greater aspect ratio when filling a dielectric layer between adjacent memory cells, such that unwanted void defects and humps may be formed between adjacent memory cells and overlying the memory cells. The formation of the void defects and humps introduces insulation problems and makes formation of cap spacers and/or sidewalls spacers more difficult.

The present disclosure relates to an improved integrated circuit having an embedded flash memory device with a word line having its height reduced, and associated processing methods. In some embodiments, the flash memory device comprises a gate stack separated from a substrate by a gate dielectric. The gate stack comprises a control gate separated from a floating gate by a control gate dielectric. An erase gate is disposed on a first side of the gate stack and a word line is disposed on a second side of the gate stack that is opposite to the first side. The word line has a height that monotonically increases from an outer side opposite to the gate stack to an inner side closer to the gate stack. A word line height at the outer side is smaller than an erase gate height. The shape of the word line improves contact resistance, and also eliminates "pulled-up" edges that affect filling of an overlying dielectric layer, thereby providing more reliable read/write operations and/or better performance.

FIG. 1 shows some embodiments of a cross-sectional view of a flash memory device 100 having a word line height smaller than an erase gate height. The flash memory device 100 comprises source/drain regions 126 and 128 arranged within a substrate 102. In some embodiments, the source/drain regions may comprise a common source/drain region 128 laterally positioned between individual source/drain regions 126. A gate stack 130 is laterally disposed between the source/drain regions 126 and 128, and is vertically separated from the substrate 102 by a gate dielectric layer 104. The gate stack 130 comprises a control gate 110 that is separated from a floating gate 106 by a control gate dielectric 108. In some embodiments, the gate stack 130 may further include a hard mask 112 disposed over the control gate 110, but in other embodiments, the hard mask 112 is not present. In some embodiments, the hard mask 112 may comprise silicon nitride or silicon oxynitride, for example.

An erase gate 122 is disposed on a first side of the gate stack 130 overlying the common source/drain region 128. The erase gate 122 is vertically separated from the common source/drain region 128 by the gate dielectric layer 104. The erase gate 122 is laterally separated from the gate stack 130 by a floating gate spacer 118 (e.g., silicon dioxide) and a control gate spacer 114. In some embodiments, the erase gate 122 may have a concave top surface 121s. A word line 116 is disposed on a second side of the gate stack 130 that is opposite the first side. The word line 116 may be separated from the gate stack 130 by the floating gate spacer 118 and the control gate spacer 114. In some embodiments, the floating gate spacer 118 and the control gate spacer 114 may comprise the same dielectric material or different dielectric materials. For example, the floating gate spacer 118 and the control gate spacer 114 may comprise silicon dioxide and/or silicon nitride.

In some embodiments, a word line height h1 at the outer side of the gate stack is smaller than an erase gate height h2. In some embodiments, the word line height h1 is about 70% to about 80% of the erase gate height h2. For example, the word line height h1 may be in a range of from about 500 Å to about 1200 Å, and the erase gate height h2 may be in a range of from about 700 Å to about 1500 Å. In some embodiments, a height h of the word line 116 monotonically increases from an outer side 111 (i.e., a side of the word line 116 that is opposite to the gate stack 130) to an inner side 113 closer to the gate stack 130. In other words, the height h of the word line 116 does not decrease from the outer side 111 to the inner side 113, although it may be flat at some parts (e.g., at one or both edges, not shown in FIG. 1). In some embodiments, the slope of the upper surface 117s may increase from the outer side 111 to the inner side 113. The erase gate 122 and the word line 116 may comprise the same material and/or share the same crystalline structure. For example, in some embodiments, the word line 116 and/or the erase gate 122 may comprise doped polycrystalline silicon. In other embodiments, the word line 116 and/or the erase gate 122 may comprise other conductive materials such as metal, for example. A sidewall spacer 120 may be disposed along an outer sidewall of the word line 116. In some embodiments, the sidewall spacer 120 may comprise oxide. The reduced height of the outer side 111 of the word line 116 results in a good filling of subsequent formed interlayer dielectric between adjacent memory cells.

Figure 2:
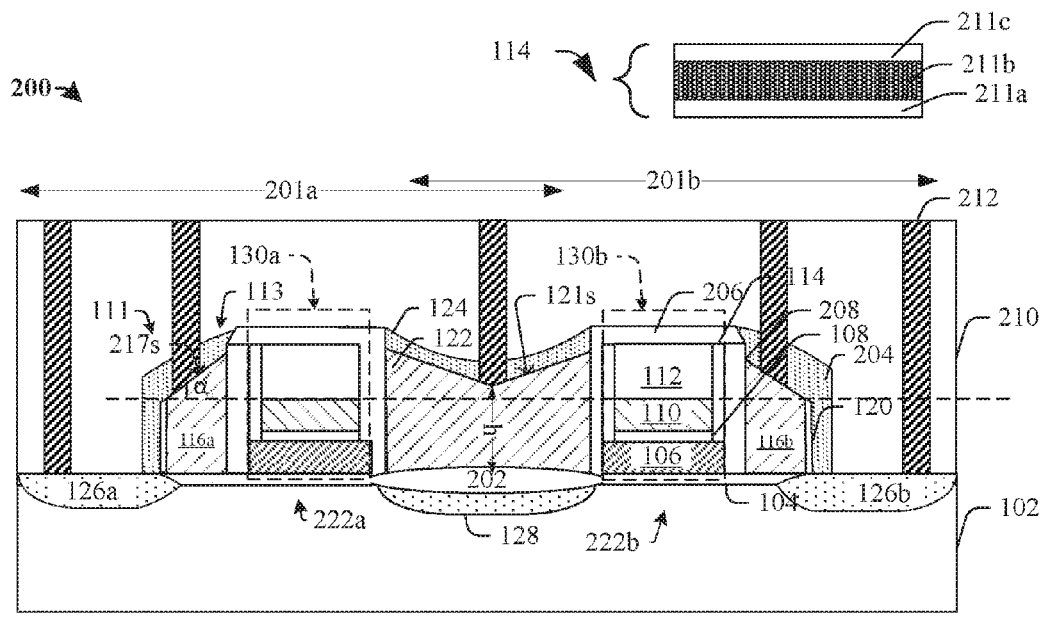
FIG. 2 illustrates a cross-sectional view of some other embodiments of a flash memory device having a word line height smaller than an erase gate height.

FIG. 2 shows some other embodiments of a cross-sectional view of a flash memory device 200 having a word line height smaller than an erase gate height. The flash memory device 200 comprises a first flash memory cell 201a and a second flash memory cell 201b configured to respectively store one or more bits of data in a non-volatile manner. In some embodiments, the first flash memory cell 201a and the second flash memory cell 201b can be mirror images of one another about a central axis. A common source/drain region 128 is laterally arranged between first and second individual source/drain regions, 126a and 126b within the substrate 102. The common source/drain region 128 is separated from the first individual source/drain region 126a by a first channel region 222a, and is separated from the second individual source/drain region 126b by a second channel region 222b.

Gate stacks 130 are respectively disposed over the channel regions 222 and are separated from the channel regions 222 by a gate dielectric layer 104. For example, a first gate stack 130a is disposed over the first channel region 222a and a second gate stack 130b is disposed over the second channel region 222b. In some embodiments, the gate stacks 130a, 130b respectively comprise a floating gate 106 and a control gate 110 separated by a control gate dielectric 108. A hard mask 112 can also be arranged over the control gate 110, and a control gate spacer 114 can cover sidewalls of the control gate 110 and the control gate dielectric 108, and rest on the floating gate 106. In some embodiments, the control gate spacer 114 may comprise multiple layers, for example, a nitride layer 211b arranged between a first oxide layer 211a and a second oxide layer 211c. A first word line 116a is disposed on one side of the first gate stack 130a and a second word line 116b is disposed on one side of the second gate stack 130b. In some embodiments, the word lines 116a, 116b may have an upper surface 217s with a continuously upwardly sloping contour. In some embodiments, a tilt angle α from a lateral plane parallel to an upper surface of the substrate 102 to an upper surface 217s of the word lines 116a, 116b may be in a range of 30° to 60°. A slope of the upper surface 217s may be substantially constant.

An erase gate 122 is disposed between the other sides of the first and second gate stacks 130a, 130b above the common source/drain region 128, with an erase gate dielectric 202 separating the erase gate 122 from the common source/drain region 128. In some embodiments, the erase gate 122 has an upper surface 121s with a greater height at a peripheral region than a central region. An erase gate cap spacer 124 can be disposed directly above the erase gate 122. A word line cap spacer 204 can be disposed on the word lines 116a, 116b. In some embodiments, the word line cap spacer 204 and the erase gate cap spacer 124 can be made of silicon dioxide and/or silicon nitride. An inner sidewall spacer 206 may be disposed between the gate stacks 130a, 130b and the erase gate 122. The inner sidewall spacer 206 may include a tunneling oxide layer separating the erase gate 122 from the floating gates 106. The inner sidewall spacer 206 may extend to cover a top surface of the gate stacks 130a, 130b. A floating gate spacer 208 may be disposed between the gate stacks 130a, 130b and the word lines 116a, 116b, separating the corresponding floating gates 106 from the word lines 116a, 116b. A sidewall spacer 120 may be disposed along an outer sidewall of the word lines 116a, 116b. In some embodiments, the inner sidewall spacer 206, the floating gate spacer 208, or the sidewall spacer 120 may comprise silicon dioxide.

An interlayer dielectric (ILD) layer 210 can be arranged over the gate stacks 130a, 130b, the erase gate 122, and the word lines 116a, 116b. Conductive contacts 212 can extend through the ILD layer 210 to source/drain regions 126a, 126b, word lines 116a, 116b, and erase gate 122. The word lines 116a, 116b provide for sufficient thickness to block source/drain implants used during fabrication of the flash memory device 200 to form the source/drain regions 126 and 128, while also having proper heights and upper surface profiles that allow for good filling of the interlayer dielectric 210 between adjacent memory cells and overlying the word lines 116a, 116b.

During operation, the memory cells, 201a and 201b, independently store variable amounts of charge (e.g., electrons) in corresponding floating gates 106, respectively. The amount of charge stored on the floating gates 106 represents data states stored in the respective cells 201a, 201b, and can be varied through program, read, and erase operations. For example, during a program operation, a word line bias (e.g., +1V) is applied to the word line 116b of the memory cell 201b and a larger magnitude voltage (e.g., +11V) is applied to the control gate 110, thereby inducing formation of a conductive channel in the channel region 222b. While this bias condition is applied, a positive voltage (e.g., +5 volt) is concurrently applied to both the common source/drain region 128 and erase gate 122 to induce electrons to flow from the individual source/drain region 126b towards the common source/drain region 128. The high bias voltage on the control gate 110 promotes Fowler-Nordheim tunneling of carriers from the channel region 222b towards the control gate 110. As the carriers tunnel towards the control gate 110, at least some carriers become trapped in the floating gate 106, and thus alter the voltage threshold of the memory cell 201b to correspond to a predetermined voltage threshold associated with a program data state (e.g., logical "1").

During an erase operation of the memory cell 201b, the erase gate 122 is biased with a high voltage (e.g., +13V) while the control gate 110 and the word line 116b are held at a low voltage (e.g., 0 V). The high bias erase gate voltage promotes Fowler-Nordheim tunneling of carriers from the floating gate 106 towards the erase gate 122. As the carriers tunnel towards the erase gate 122, electrons in the floating gate 106 are now removed from the floating gate 106, altering the voltage threshold of the memory cell 201b to correspond to a predetermined voltage threshold associated with an erase data state (e.g., logical "0").

Because charge stored in the floating gate 106 screens an electric field formed between the control gate 110 and the channel region 222b, the charge stored on the floating gate 106 can alter the threshold voltage $V_{th}$ of the memory cell 201b by an amount $\Delta V_{th}$. Therefore, during a read operation of the memory cell 201b, the word line 116b is biased (e.g., +3V) and the control gate 110 is biased with a read voltage (e.g., +2V), which is greater than $V_{th}$, but less than $V_{th}+\Delta V_{th}$. Depending on whether current flows between the individual source/drain region 126b and the common source/drain region 128 (or not), read circuitry of the memory device can correspondingly determine whether the memory cell 201b is in the program state (e.g., logical "1") or erase state (logical "0").

FIGS. 3-14 illustrate some embodiments of cross-sectional views 300-1400 of a method of forming a flash memory cell having a word line height smaller than an erase gate height.

Figure 3:
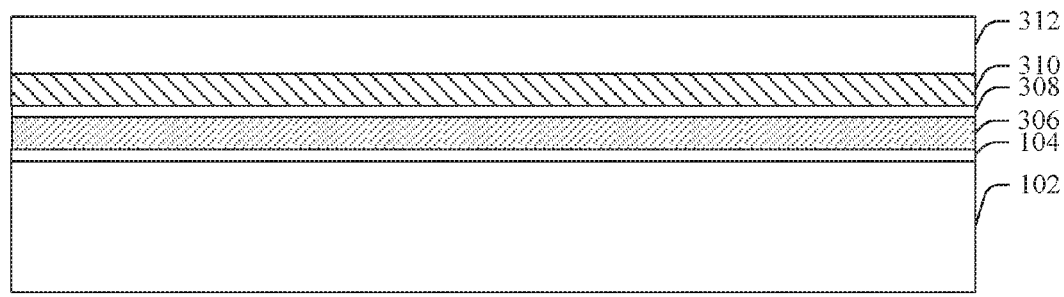
FIGS. 3-14 illustrate some embodiments of cross-sectional views of a method of forming a flash memory cell having a word line height smaller than an erase gate height.

As illustrated by cross-sectional view 300 of FIG. 3, a substrate 102 is provided. A gate dielectric layer 104, a floating gate layer 306, a control gate dielectric layer 308, a control gate layer 310 and a hard mask layer 312 are formed in succession over the substrate 102 by deposition techniques such as chemical vapor deposition (CVD) or physical vapor deposition (PVD) followed by planarization processes. In various embodiments, the substrate 102 may comprise any type of semiconductor body (e.g., silicon/CMOS bulk, SiGe, SOI, etc.) such as a semiconductor wafer or one or more die on a wafer, as well as any other type of semiconductor and/or epitaxial layers formed thereon and/or otherwise associated therewith.

Figure 4:
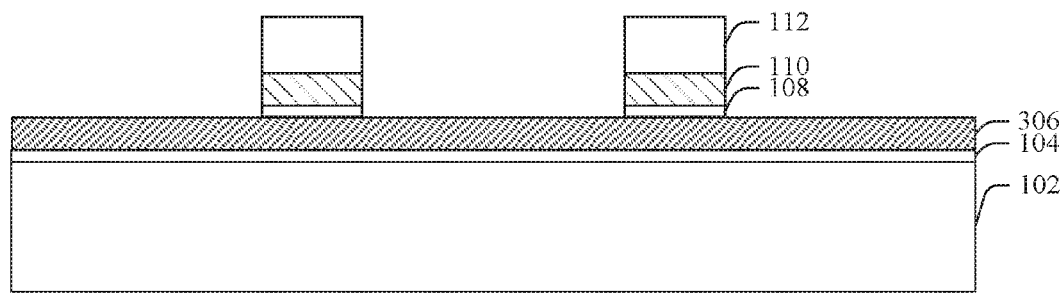

As illustrated by cross-sectional view 400 of FIG. 4, the control gate layer 310 and the control gate dielectric layer 308 (shown in FIG. 3) are patterned to form a control gate 110 and a control gate dielectric 108. In some embodiments, a hard mask 112 is formed by using a photolithography process to pattern the hard mask layer 312 (shown in FIG. 3). Then the control gate 110 and the control gate dielectric 108 are patterned according to the hard mask 112.

Figure 5:
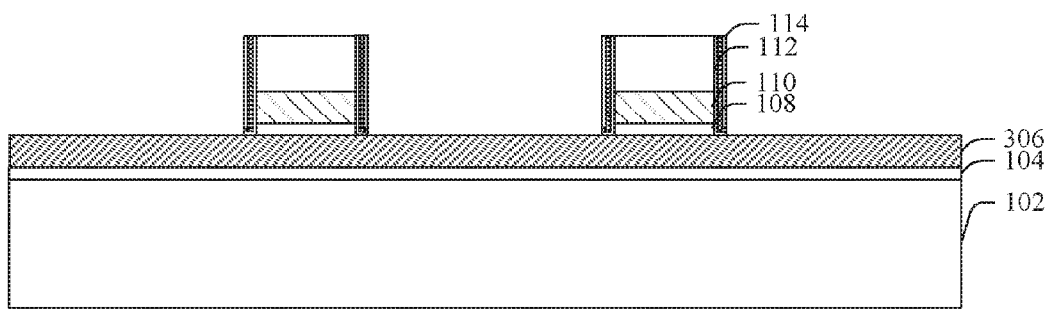

As illustrated by cross-sectional view 500 of FIG. 5, a control gate spacer 114 is formed along sidewalls of the hard mask 112, the control gate 110, and the control gate dielectric 108. In some embodiments, the control gate spacer 114 is formed by depositing one or multiple conformal layers of dielectric material (using CVD or PVD techniques) followed by an anisotropic etching process, to remove lateral portions of the dielectric layers and to leave vertical portions along the sidewalls of the hard mask 112, the control gate 110, and the control gate dielectric 108.

Figure 6:
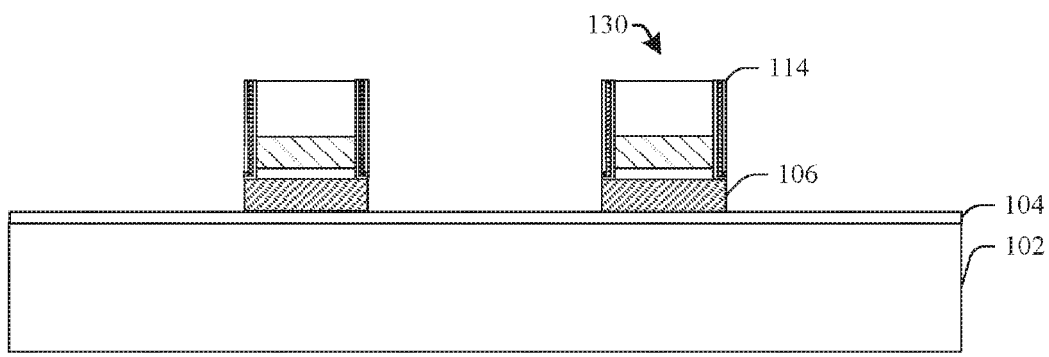

As illustrated by cross-sectional view 600 of FIG. 6, the floating gate layer 306 is patterned according to the control gate 110 and the control gate spacer 114, to form a floating gate 106 underneath the control gate dielectric 108. The floating gate 106 may be formed by a dry etching process and/or a wet etching process. A gate stack 130 is formed including the control gate 110 and the floating gate 106 separated by the control gate dielectric 108.

Figure 7:
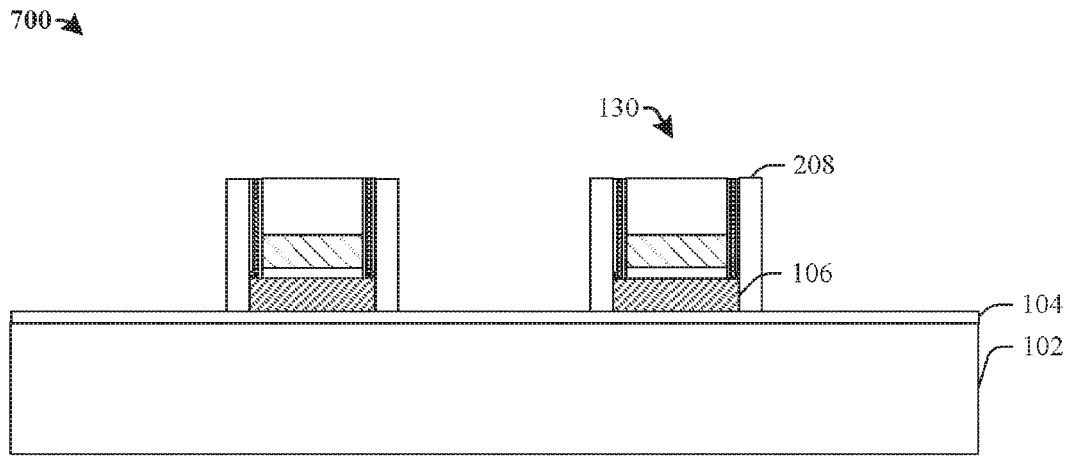

As illustrated by cross-sectional view 700 of FIG. 7, a floating gate spacer 208 is formed along sidewalls of the gate stack 130. In some embodiments, the floating gate spacer 208 abuts the control gate spacer 114 and the floating gate 106. In some embodiments, the floating gate spacer 208 is formed by depositing one or multiple conformal layers of dielectrics (using CVD or PVD techniques) followed by a vertical etching process, to remove lateral portions of the dielectrics and to leave vertical portions along the sidewalls.

Figure 8:
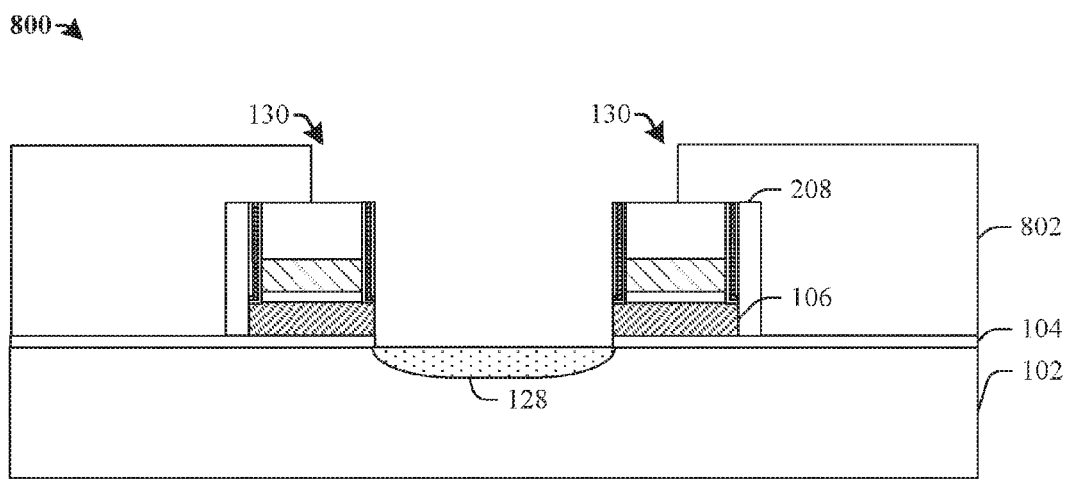

As illustrated by cross-sectional view 800 of FIG. 8, a common source/drain region 128 is formed between the pair of gate stacks 130. Inner portions of the floating gate spacer 208 between the pair of gate stacks 130 (shown in FIG. 7) are removed, to expose inner sidewalls of the floating gates 106. In some embodiments, a wet etching process may be performed to remove the inner portions of the floating gate spacer 208, with a masking layer 802 covers remaining regions of the work piece.

Figure 9:
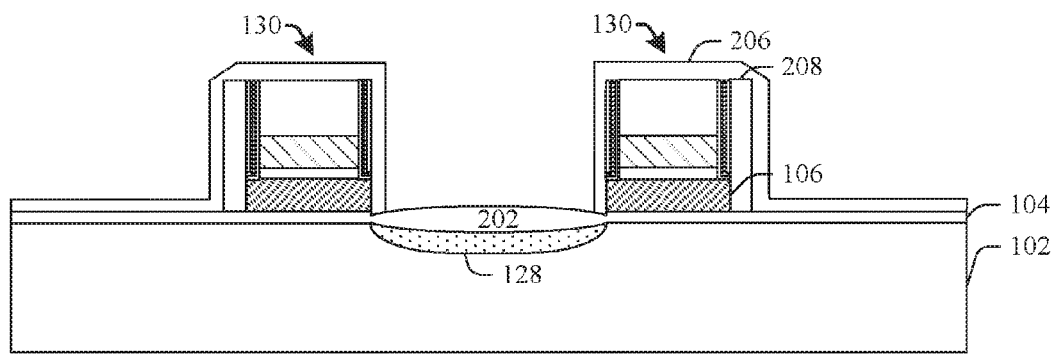

As illustrated by cross-sectional view 900 of FIG. 9, an inner sidewall spacer 206 is conformally deposited along a topology of the gate stacks 130, including a tunnel oxide abutting the inner sidewalls of the floating gates 106. In some embodiments, the inner sidewall spacer 206 is formed to cover and/or abut top surfaces of the hard mask 112, the control gate spacer 114, and the floating gate spacer 208. A common source oxide 202 is formed on the common source/drain region 128.

Figure 10:
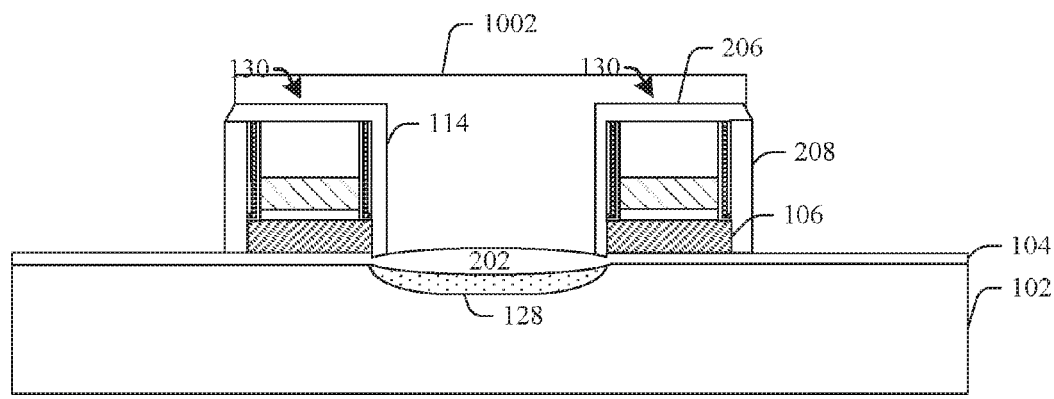

As illustrated by cross-sectional view 1000 of FIG. 10, in some embodiments, the inner sidewall spacer 206 is partially removed about outer sides of the pair of gate stacks 130, having inner portions between the pair of gate stacks 130 covered by a masking layer 1002.

Figure 11:
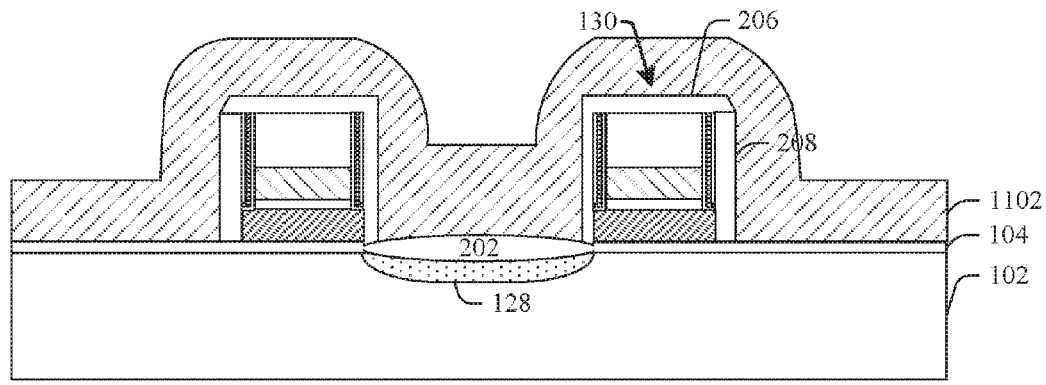

As illustrated by cross-sectional view 1100 of FIG. 11, a conductive material 1102 is formed over the substrate 102 and along a topology of the gate stacks 130. The conductive material 1102 is conformally formed over the inner sidewall spacer 206, the floating gate spacer 208, and the gate dielectric layer 104. In some embodiments, the conductive material 1102 comprises doped polysilicon.

Figure 12:
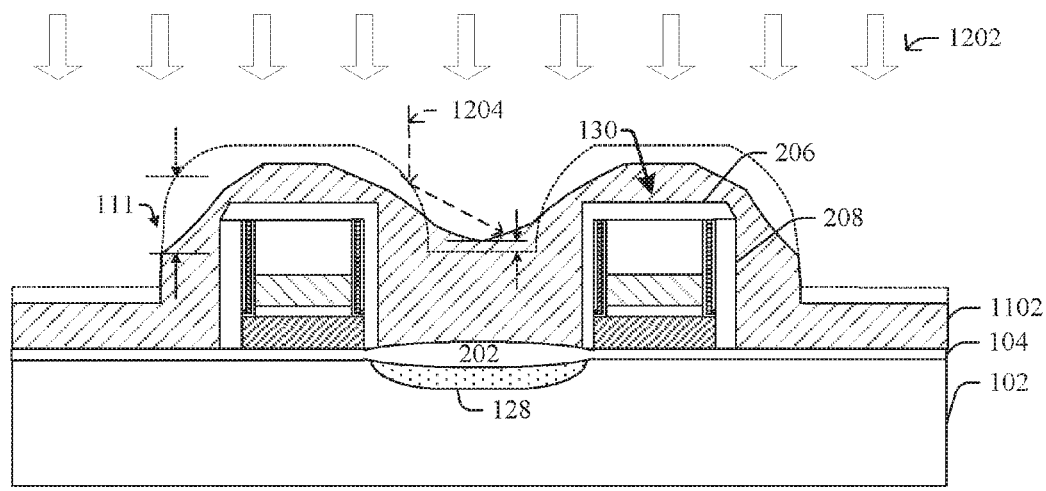

As illustrated by cross-sectional view 1200 of FIG. 12, an ion treatment process 1202 is performed to the conductive material 1102, such that an upper corner of the conductive material 1102 locating at opposite sides of the pair of gate stacks 130 is lowered while a middle region of the conductive material 1102 between the pair of gate stacks 130 is raised by a byproduct of the ion treatment process. An example of a top surface contour of the conductive material 1102 is shown in FIG. 12. As shown by dashed lines 1204, since a lateral spacer between the pair of gate stacks is relative small, the ion treatment process 1202 strikes and removes some atoms of the conductive material 1102 which is then redeposited on a closer position in the middle region of the conductive material 1102, thereby raising a corresponding surface by the byproduct. In contract, an outer side 111 of the word lines to be formed, i.e. the upper corner of the conductive material 1102 is removed. In some embodiments, the upper corner of the conductive material 1102 is reduced to a position lower than a central region of the conductive material 1102 between the pair of gate stacks 130. In some embodiments, the ion treatment process 1202 comprises an argon (Ar) ion bombardment process.

Figure 13:
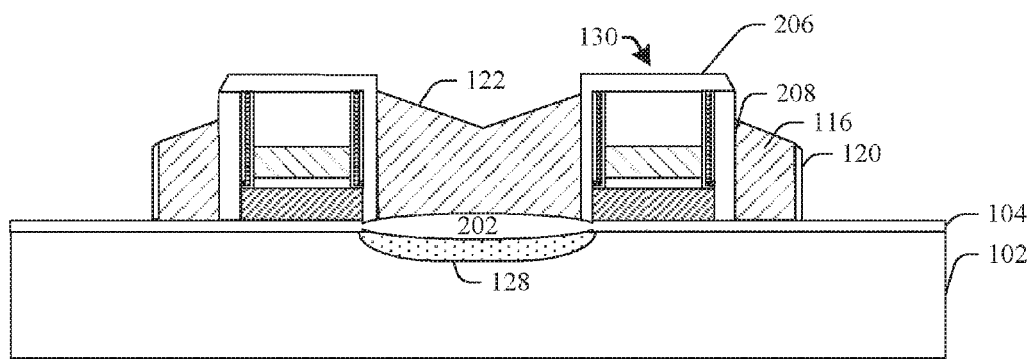

As illustrated by cross-sectional view 1300 of FIG. 13, an anisotropic etch back process is performed on the conductive material 1102 (shown in FIG. 12) to form word lines 116 on opposite sides of the pair gate stacks 130 and an erase gate 122 between the pair of gate stacks 130. In some embodiments, the ion treatment process of FIG. 11 and the etch back process are performed in-situ in one dry etching chamber. In some embodiments, an oxidation process is involved in the etch back process to form a sidewall spacer 120 along an upper sidewall of the word lines 116 and have the word lines 116 self-aligned. The conductive material 1102 (shown in FIG. 12) can be etched back by a dry etchant comprising oxygen as one of the react gases. In some other embodiments, the sidewall spacer 120 is formed by forming a dielectric liner over the conductive material 1102 (shown in FIG. 12) or the word lines 116 and performing an anisotropic etch through the dielectric liner to remove excessive lateral portions and to leave a sidewall portion of the dielectric liner along sidewalls of the word lines 116.

Figure 14:
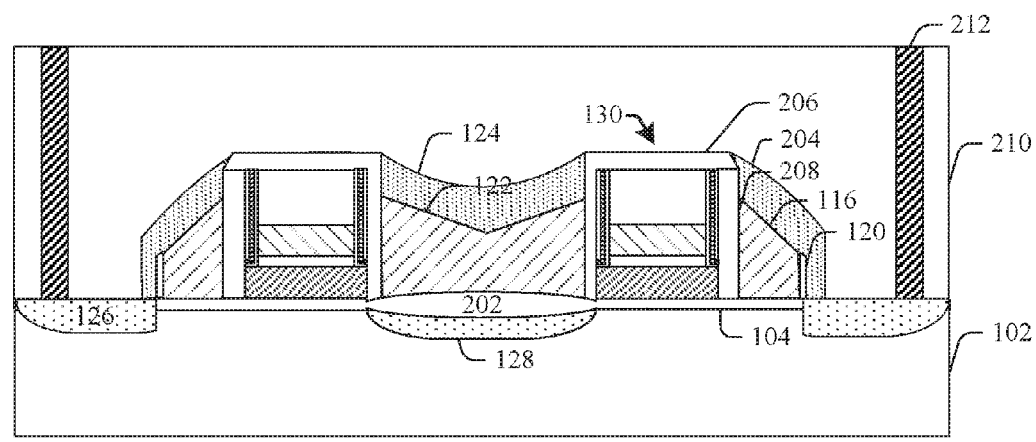

As illustrated by cross-sectional view 1400 of FIG. 14, source/drain regions 126 are formed within an upper region of the substrate 102 at the opposite sides of the word lines 116. In some embodiments, the source/drain regions 126 may be formed by selectively implanting dopant species into the substrate 102. A dielectric layer is formed and patterned to form an erase gate cap spacer 124 overlying the erase gate 122 and a word line cap spacer 204 overlying the word lines 116. An interlayer dielectric (ILD) layer is formed over the gate stacks 130 and the word lines 116. Contacts are formed extending through the ILD layer to the source/drain regions 126.

Figure 15:
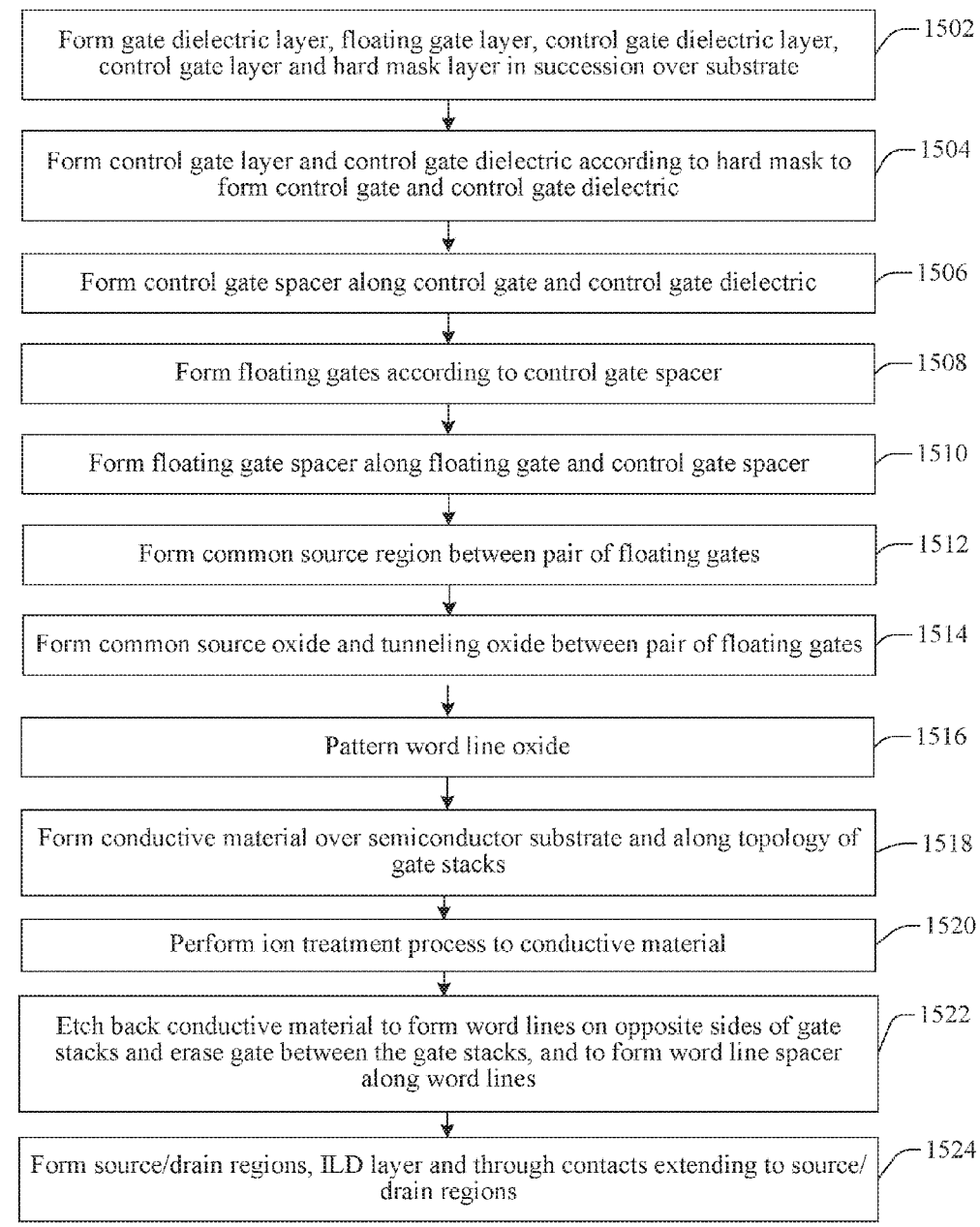
FIG. 15 illustrates a flow diagram of some embodiments of a method of forming a flash memory cell having a word line height smaller than an erase gate height.

FIG. 15 shows some embodiments of a flow diagram of a method 1500 of forming a flash memory device. Although method 1500 is described in relation to FIGS. 3-14, it will be appreciated that the method 1500 is not limited to such structures disclosed in FIGS. 3-14, but instead may stand alone independent of the structures disclosed in FIGS. 3-14. Similarly, it will be appreciated that the structures disclosed in FIGS. 3-14 are not limited to the method 1500, but instead may stand alone as structures independent of the method 1500. Also, while disclosed methods (e.g., method 1500) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1502, a substrate is provided. A gate dielectric layer, a floating gate layer, a control gate dielectric layer, a control gate layer, and a hard mask layer are formed in succession over the substrate. FIG. 3 illustrates some embodiments of a cross-sectional view 300 corresponding to act 1502.

At 1504, the control gate layer and the control gate dielectric layer are patterned to form a control gate and a control gate dielectric. FIG. 4 illustrates some embodiments of a cross-sectional view 400 corresponding to act 1504.

At 1506, a control gate spacer is formed along sidewalls of the hard mask, the control gate, and the control gate dielectric. FIG. 5 illustrates some embodiments of a cross-sectional view 500 corresponding to act 1506.

At 1508, the floating gate layer is patterned according to the control gate and the control gate spacer, to form a floating gate underneath the control gate dielectric. FIG. 6 illustrates some embodiments of a cross-sectional view 600 corresponding to act 1508.

At 1510, a floating gate spacer is formed along sidewalls of the gate stack. FIG. 7 illustrates some embodiments of a cross-sectional view 700 corresponding to act 1510.

At 1512, a common source/drain region is formed between the pair of gate stacks. FIG. 8 illustrates some embodiments of a cross-sectional view 800 corresponding to act 1512.

At 1514, an inner sidewall spacer is conformally deposited along a topology of the gate stacks. FIG. 9 illustrates some embodiments of a cross-sectional view 900 corresponding to act 1514.

At 1516, the inner sidewall spacer is partially removed about outer sides of the pair of gate stacks, having inner portions between the pair of gate stacks covered by a masking layer. FIG. 10 illustrates some embodiments of a cross-sectional view 1000 corresponding to act 1516.

At 1518, a conductive material is formed over the substrate and along a topology of the gate stacks. FIG. 11 illustrates some embodiments of a cross-sectional view 1100 corresponding to act 1518.

At 1520, an ion treatment process is performed to the conductive material, such that an upper corner of the conductive material locating at opposite sides of the pair of gate stacks is lowered while a middle region of the conductive material between the pair of gate stacks is raised by a byproduct of the ion treatment process. FIG. 12 illustrates some embodiments of a cross-sectional view 1200 corresponding to act 1520.

At 1522, an etch back process is performed to the conductive material to form word lines on opposite sides of the pair gate stacks and an erase gate between the pair of gate stacks. FIG. 13 illustrates some embodiments of a cross-sectional view 1300 corresponding to act 1522.

At 1524, source/drain regions are formed within an upper region of the substrate at the opposite sides of the word lines. Contacts are formed extending through the ILD layer to the source/drain regions. FIG. 14 illustrates some embodiments of a cross-sectional view 1400 corresponding to act 1524.

FIGS. 16-21 illustrate some embodiments of cross-sectional views 1600-2100 of a method of forming a flash memory cell having a word line height smaller than an erase gate height.

Figure 16:
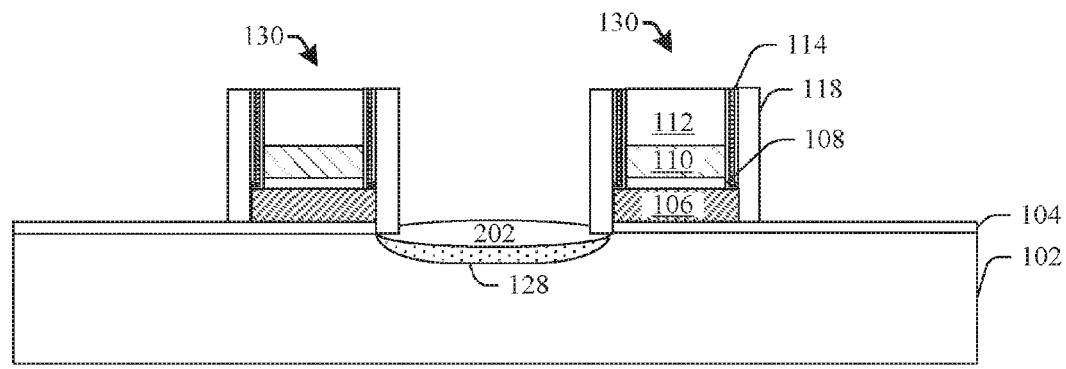
FIGS. 16-21 illustrate some other embodiments of cross-sectional views of a method of forming a flash memory cell having a word line height smaller than an erase gate height.

As illustrated by cross-sectional view 1600 of FIG. 16, a substrate 102 is provided including a pair of gate stacks 130 disposed over a gate dielectric layer 104.

Figure 17:
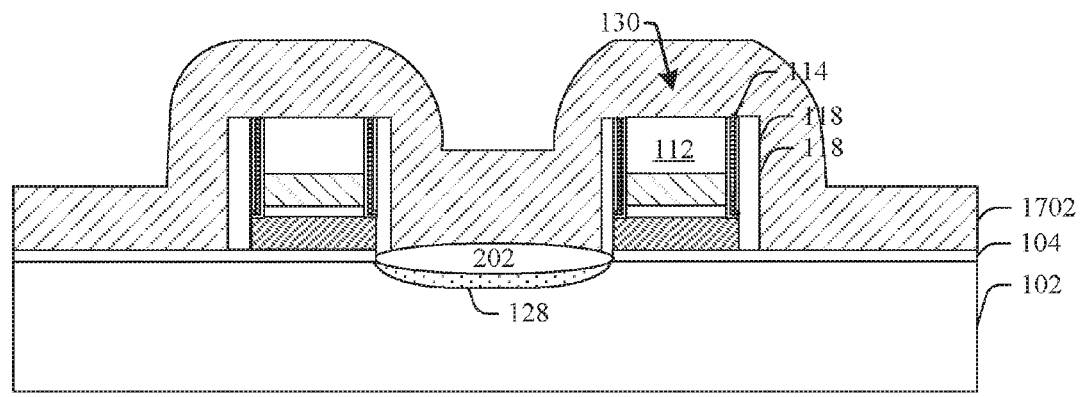

As illustrated by cross-sectional view 1700 of FIG. 17, a conductive material 1702 is formed over the substrate 102 and along a topology of the gate stacks 130. The conductive material 1702 is conformally formed over the pair of gate stacks 130 and the gate dielectric layer 104. In some embodiments, the conductive material 1702 comprises doped polysilicon.

Figure 18:
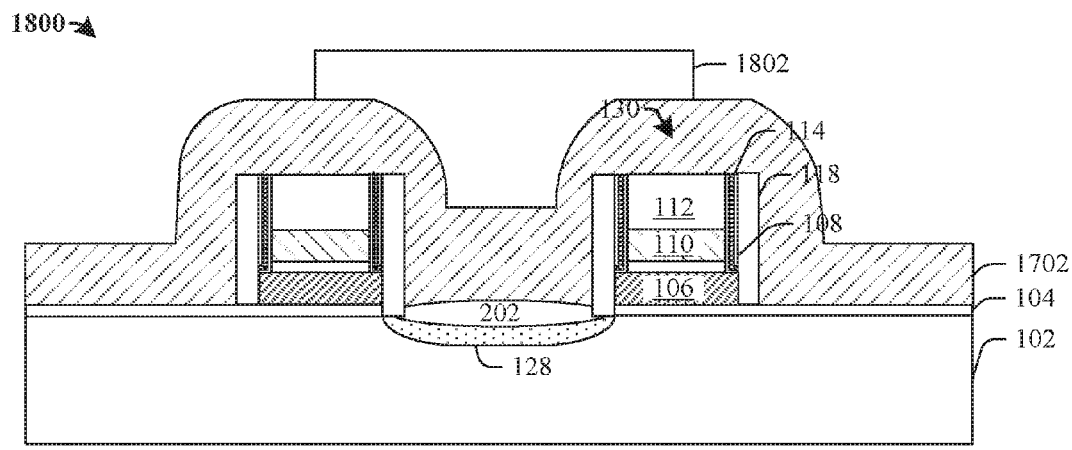

As illustrated by cross-sectional view 1800 of FIG. 18, a masking layer 1802 is formed overlying an inner portion of the conductive material 1702 between the pair of gate stacks 130.

Figure 19:
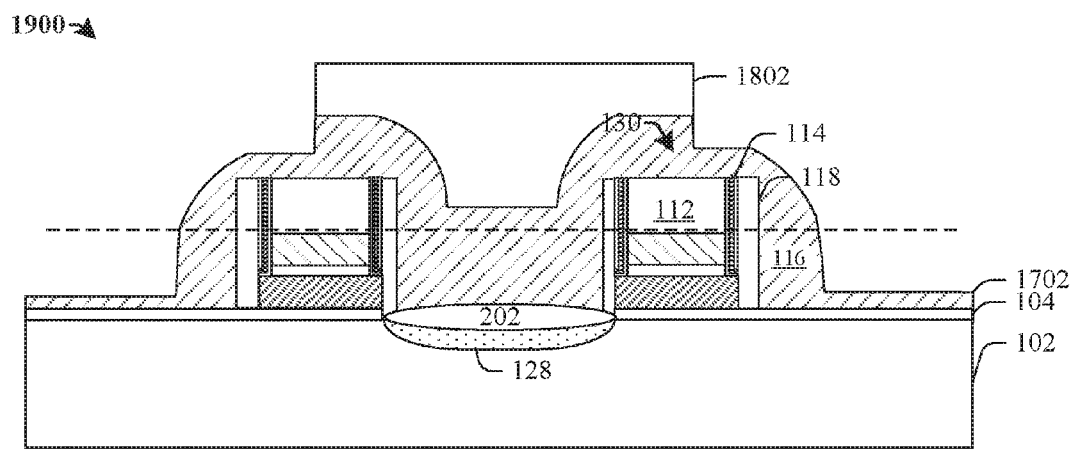

As illustrated by cross-sectional view 1900 of FIG. 19, a first etch back process is performed to the conductive material 1702 with the masking layer 1802 in place, such that an outer portion of the conductive material 1702 locating at opposite sides of the pair of gate stacks 130 is lowered while a middle region of the conductive material 1702 between the pair of gate stacks 130 is protected by the masking layer and un-altered. The first etch back process may comprise a dry etch process and/or a wet etch process.

Figure 20:
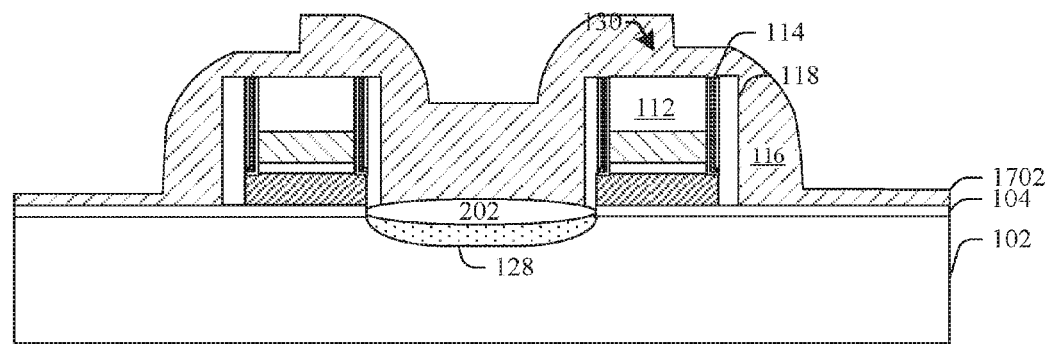

As illustrated by cross-sectional view 2000 of FIG. 20, the masking layer 1802 is removed. In some embodiments, the masking layer 1802 is removed in-situ with the first etch back process of FIG. 19, for example, by an ash post dry etch process or an ash during dry etch process.

Figure 21:
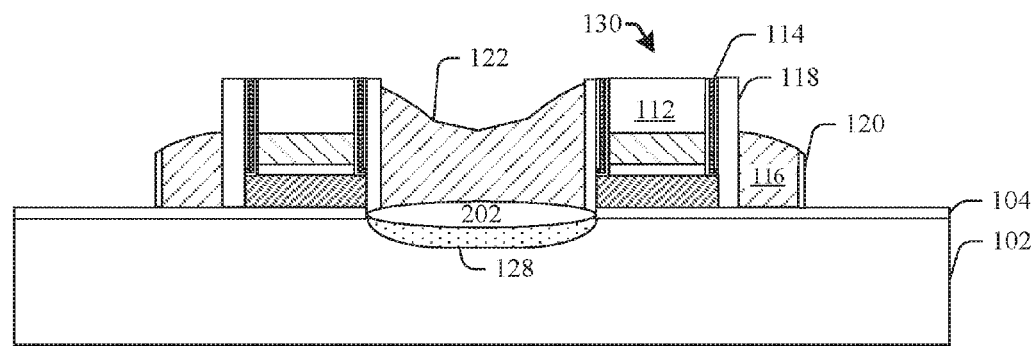

As illustrated by cross-sectional view 2100 of FIG. 21, a second etch back process is performed to the conductive material 1702 after the masking layer 1802 is removed, to form word lines 116 self-aligned on opposite sides of the pair gate stacks 130 and an erase gate 122 between the pair of gate stacks 130. In some embodiments, the second etching back process comprises a dry etch including halogen, oxygen, and fluoride gases. The first etch back process and the second etch back process may be performed in-situ in one dry etching chamber. A sidewall spacer 120 is formed along sidewalls of the word lines 116.

Figure 22:
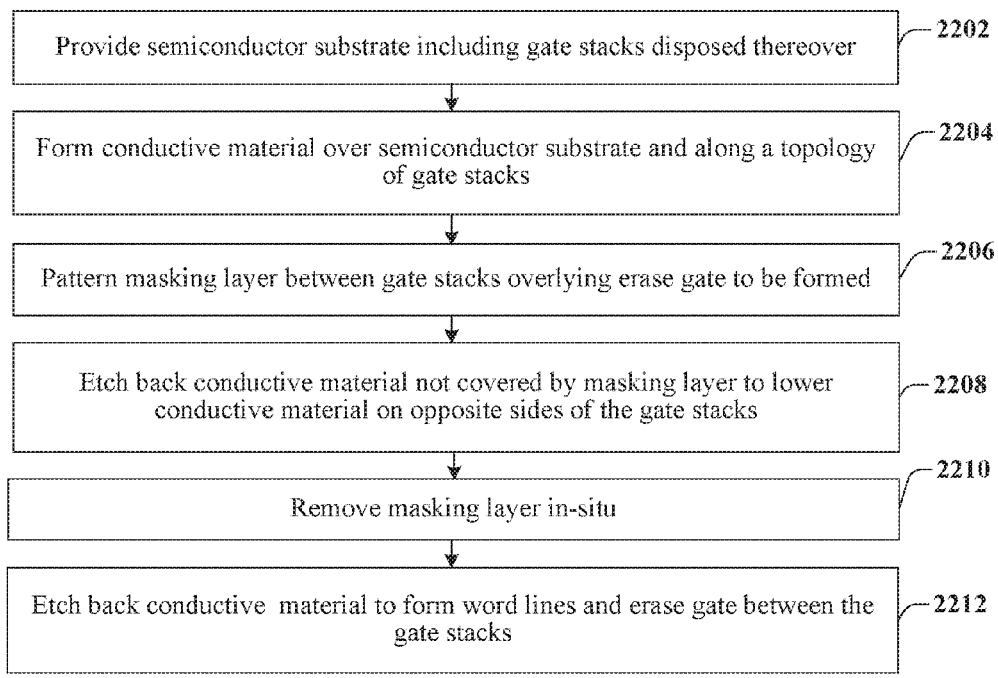
FIG. 22 illustrates a flow diagram of some other embodiments of a method of forming a flash memory cell having a word line height smaller than an erase gate height.

FIG. 22 shows some embodiments of a flow diagram of a method 2200 of forming a flash memory device. Although method 2200 is described in relation to FIGS. 16-21, it will be appreciated that the method 2200 is not limited to such structures disclosed in FIGS. 16-21, but instead may stand alone independent of the structures disclosed in FIGS. 16-21. Similarly, it will be appreciated that the structures disclosed in FIGS. 16-21 are not limited to the method 2200, but instead may stand alone as structures independent of the method 2200. Also, while disclosed methods (e.g., method 2200) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 2202, a substrate is provided including a pair of gate stacks disposed over a gate dielectric layer. FIG. 16 illustrates some embodiments of a cross-sectional view 1600 corresponding to act 2202.

At 2204, a conductive material is formed over the substrate and along a topology of the gate stacks. FIG. 17 illustrates some embodiments of a cross-sectional view 1700 corresponding to act 2204.

At 2206, a masking layer is formed overlying an inner portion of the conductive material between the pair of gate stacks. FIG. 18 illustrates some embodiments of a cross-sectional view 1800 corresponding to act 2206.

At 2208, a first etch back process is performed to the conductive material with the masking layer in place, such that an outer portion of the conductive material locating at opposite sides of the pair of gate stacks is lowered while a middle region of the conductive material between the pair of gate stacks is protected by the masking layer and un-altered. FIG. 19 illustrates some embodiments of a cross-sectional view 1900 corresponding to act 2208.

At 2210, the masking layer is removed. FIG. 20 illustrates some embodiments of a cross-sectional view 2000 corresponding to act 2210.

At 2212, a second etch back process is performed to the conductive material after the masking layer being removed, to form word lines self-aligned on opposite sides of the pair gate stacks and an erase gate between the pair of gate stacks. FIG. 21 illustrates some embodiments of a cross-sectional view 2100 corresponding to act 2212.

Thus, the present disclosure provides a self-aligned flash memory device comprising a word line disposed on a side of a gate stack, having an upwardly sloping contour from an outer side opposite to a gate stack to an inner side closer to the gate stack. A word line height is reduced to eliminate "pulled-up" edges that affect filling of an overlying dielectric layer, thereby providing more reliable read/write operations and/or better performance.

In some embodiments, the present disclosure relates to a flash memory device. The flash memory device comprises a gate stack separated from a substrate by a gate dielectric, the gate stack comprising a control gate separated from a floating gate by a control gate dielectric. The flash memory device further comprises an erase gate disposed on a first side of the gate stack. The flash memory device further comprises a word line disposed on a second side of the gate stack that is opposite the first side. The word line has a height that monotonically increases from an outer side opposite to the gate stack to an inner side closer to the gate stack. A word line height at the outer side of the gate stack is smaller than an erase gate height.

In other embodiments, the present disclosure relates to a method of forming a flash memory device. The method comprises providing a semiconductor substrate including a pair of gate stacks disposed thereover. The gate stacks include floating gates and control gates arranged over the floating gates. The method further comprises forming a conductive material over the semiconductor substrate and along a topology of the gate stacks. The method further comprises performing a series of etching processes to form word lines on opposite sides of the gate stacks and an erase gate between the gate stacks. A first height of the word lines is smaller than a second height of the erase gate In yet other embodiments, the present disclosure relates to a method of forming a flash memory device. The method comprises providing a semiconductor substrate including a pair of gate stacks disposed thereover. The gate stacks include floating gates and control gates arranged over the floating gates. The method further comprises forming a conductive material over the semiconductor substrate and along a topology of the gate stacks. The method further comprises performing an ion treatment process to the conductive material such that an upper corner of the conductive material locating at opposite sides of the pair of gate stacks is lowered while a middle region of the conductive material between the pair of gate stacks is raised by a byproduct of the ion treatment process. The method further comprises performing an etch back process to the conductive material vertically to form word lines on opposite sides of the gate stacks and an erase gate between the gate stacks.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a flash memory device, comprising:
    providing a substrate including a pair of gate stacks disposed thereover, wherein the gate stacks include floating gates and control gates arranged over the floating gates and separated from the floating gates by a control dielectric;
    forming a conductive material over the substrate and along a topology of the gate stacks;
    forming a masking layer to cover a first portion of the conductive material between the gate stacks and to expose a second portion of the conductive material on opposite sides of the gate stacks;
    performing a first etching process to lower the second portion of the conductive material;
    removing the masking layer; and
    performing a series of etching processes to form word lines on opposite sides of the gate stacks and an erase gate between the gate stacks;
    wherein a first height of the word lines is smaller than a second height of the erase gate.

2. The method of claim 1, wherein the series of etching processes comprises an argon ion treatment process that reduces an upper corner of the conductive material locating at opposite sides of the pair of gate stacks while raises a middle region of the conductive material between the pair of gate stacks by a byproduct of the argon ion treatment process.

3. The method of claim 1, wherein the series of etching processes comprises an anisotropic etch back process that removes excessive lateral portions of the conductive material and forms a sidewall spacer along the word lines.

4. The method of claim 1, wherein the word lines are formed to have an upper surface that monotonically trends upwardly from an outer side opposite to the gate stack to an inner side closer to the gate stack.

5. The method of claim 1, wherein the erase gate is formed to have a concave top surface.

6. The method of claim 1, further comprising:
    performing a second etching process to uniformly lower the first and second portions of the conductive material after removing the masking layer.

7. The method of claim 6, wherein the second etching process comprises a dry etch including halogen, oxygen, and fluoride gases.

8. The method of claim 1, wherein the masking layer is a photoresist material and is removed in-situ with the first etching process.

9. A method of forming a flash memory device, comprising:
    providing a substrate including a pair of gate stacks disposed thereover, wherein the gate stacks include floating gates and control gates arranged over the floating gates;
    forming a conductive material over the substrate and along a topology of the gate stacks;
    performing an ion treatment process to the conductive material such that an upper corner of the conductive material locating at opposite sides of the pair of gate stacks is lowered while a middle region of the conductive material between the pair of gate stacks is raised by a byproduct of the ion treatment process; and
    performing an etch back process to the conductive material vertically to form word lines on opposite sides of the gate stacks and an erase gate between the gate stacks.

10. The method of claim 9, wherein the ion treatment process and the etch back process are performed in-situ in one dry etching chamber.

11. The method of claim 9, wherein the ion treatment process comprises an argon (Ar) ion bombardment process.

12. The method of claim 9, wherein an oxidation process is involved in the etch back process to form a sidewall spacer along an upper sidewall of the conductive material and have the word lines self-aligned.

13. The method of claim 9, further comprising:
    forming a dielectric liner over the conductive material; and
    performing an etch through the dielectric liner to remove lateral portions and to leave a sidewall portion of the dielectric liner to form a sidewall spacer along sidewalls of the word lines to be formed.

14. The method of claim 9, further comprising:
    forming source/drain regions in the substrate, wherein the source/drain regions are arranged between the pair of gate stacks and about outer sidewalls of the word lines;
    forming an interlayer dielectric (ILD) layer over the pair of gate stacks and the word lines; and
    forming contacts extending through the ILD layer to the source/drain regions.

15. A method of forming a flash memory device, comprising:
    forming a gate stack separated from a substrate by a gate dielectric, the gate stack being formed by forming a control gate separated from a floating gate by a control gate dielectric;
    forming a conductive material over the substrate and along a topology of the gate stacks;
    forming a masking layer to cover a first portion of the conductive material on a first side of the gate stacks and to expose a second portion of the conductive material on a second side of the gate stacks opposite to the first side;
    performing a first etching process to lower the second portion of the conductive material; and
    performing a second etching process to form an erase gate on the first side and a word line on the second side of the gate stack.

16. The method of claim 15, further comprising performing an ion treatment process to the conductive material prior to performing the second etching process such that an upper corner of the conductive material locating at one of the gate stack is lowered while the conductive material at the other side of the gate stack is raised by a byproduct of the ion treatment process.

17. The method of claim 15, wherein the erase gate is formed having a concave top surface.

18. The method of claim 15, wherein a word line height is about 70% to about 80% of an erase gate height.

19. The method of claim 9, prior to performing the ion treatment process, further comprising:
   forming a masking layer to cover a first portion of the conductive material between the gate stacks and to expose a second portion of the conductive material on opposite sides of the gate stacks;
   performing a first etching process to lower the second portion of the conductive material; and
   removing the masking layer.

20. The method of claim 19, further comprising:
   performing a second etching process to uniformly lower the first and second portions of the conductive material after removing the masking layer.

\* \* \* \* \*